(12) United States Patent
Gross

(10) Patent No.: US 7,603,191 B2
(45) Date of Patent: Oct. 13, 2009

(54) SYSTEM AND METHOD FOR DESIGN OF A COMPONENT

(75) Inventor: William Gross, Pasadena, CA (US)

(73) Assignee: Idealab, Pasadena, CA (US)

( * ) Notice: Subject to any disclaimer, the term of this patent is extended or adjusted under 35 U.S.C. 154(b) by 29 days.

(21) Appl. No.: 11/356,430

(22) Filed: Feb. 16, 2006

(65) Prior Publication Data

US 2006/0253214 A1 Nov. 9, 2006

Related U.S. Application Data

(60) Provisional application No. 60/653,552, filed on Feb. 16, 2005.

(51) Int. Cl.
*G06F 19/00* (2006.01)

(52) U.S. Cl. ............................... 700/97; 703/1; 705/26; 705/400

(58) Field of Classification Search ............... 700/95, 700/97, 98, 103, 105–107, 182; 705/26–29, 705/400; 703/1
See application file for complete search history.

(56) References Cited

U.S. PATENT DOCUMENTS

| 5,063,506 A | 11/1991 | Brockwell et al. |
| 5,307,260 A * | 4/1994 | Watanabe et al. ............. 705/29 |
| 5,317,503 A | 5/1994 | Inoue |
| 5,793,632 A | 8/1998 | Fad et al. |
| 5,969,973 A | 10/1999 | Bourne et al. |
| 6,134,557 A | 10/2000 | Freeman |
| 6,295,513 B1 * | 9/2001 | Thackston ...................... 703/1 |
| 6,701,200 B1 | 3/2004 | Lukis et al. |
| 6,775,647 B1 | 8/2004 | Evans et al. |
| 6,836,699 B2 | 12/2004 | Lukis et al. |
| 6,897,857 B2 | 5/2005 | Srinivasa et al. |
| 6,901,307 B2 | 5/2005 | Amano et al. |
| 6,922,676 B2 | 7/2005 | Alnwick |
| 2002/0026392 A1 * | 2/2002 | Shimizu et al. ............... 705/29 |
| 2002/0178027 A1 | 11/2002 | Kawano et al. |
| 2003/0126038 A1 | 7/2003 | Lukis |

FOREIGN PATENT DOCUMENTS

| WO | WO 00/60501 | 10/2000 |
| WO | WO 01/26009 A1 | 4/2001 |
| WO | WO 01/95205 A1 | 12/2001 |

* cited by examiner

*Primary Examiner*—Charles R Kasenge
(74) *Attorney, Agent, or Firm*—Knobbe, Martens, Olson & Bear LLP

(57) ABSTRACT

A design system is accessible to a designer and a plurality of manufacturers. The design system comprises a first user interface configured to receive design information for a component from the designer. The design system further comprises a second user interface configured to receive manufacturing information from the plurality of manufacturers. The manufacturing information comprises at least process cost information. The design system further comprises a database comprising the manufacturing information associated with each of the plurality of manufacturers. The design system further comprises a cost estimation module. The cost estimation module is configured to generate a cost estimate for producing the component for each of the plurality of manufacturers. The cost estimate is at least partially based on the process cost information. The cost estimation module is further configured to output the cost estimate for one or more of the plurality of manufacturers to the first user interface.

32 Claims, 15 Drawing Sheets

DYNAMIC PRODUCTION ESTIMATOR

Vendor providing the quote: Express Manufacturing Inc.

Vendor proximity: 627 mi.

Vendor rating: ☆☆☆☆

| Component/Part | Price |
|---|---|
| 1. Clamp mount | $ .03 |
| 2. Torx Screw(x6) | $ .01 |
| 3. Main Valve | $ .89 ◇$ |
| 4. Coupler(x4) | $ .07 |
| 5. Set screw(x8) | $ .03 |
| 6. Pivot bracket(x4) | $ .23 |
| 7. Aluminum tube(x2) | $ .09 |
| 8. Aluminum tube straight | $ .22 |
| 9. C ring(x2) | $ .31 |
| 10. Threaded anchor(x2) | $ .18 |
| 11. Brass nut(x8) | $ .05 |
| 12. Threaded bar | $ .33 ◇$ |
| 13. Pivot A | $ .02 |
| 14. Pivot B | $ .02 |
| 15. Pivot C | $ .02 |
| 16. Bearings(4mm)(x30) | $ .01 |
| 17. Fuel line join | $ .43 ◇$ |
| 18. Bearings(6mm)(x12) | $ .02 |
| 19. Brass reducer A(x4) | $ .06 |
| 20. Brass reducer B(x2) | $ .08 |
| Total | $3.10 |

Production Time

February 2005
S M T W T F S
      1 2 3 4 5
6 7 8 9 10 11 12
13 14 15 16 17 18 19
20 21 22 23 24 25 26
27 28

March 2005
S M T W T F S
      1 2 3 4 5
6 7 8 9 10 11 12
13 14 15 16 17 18 19
20 21 22 23 24 25 26
27 28 29 30 31

[ Modify Design & Recalculate ]

[ Submit Bid ]

*FIG. 3A*

Part Hints:
Change PEM Holes_1 diameter to 0.2000 and save $0.24 per part.
Change PEM Holes_2 diameter to 0.2000 and save $0.24 per part.
Change PEM Holes_3 diameter to 0.2000 and save $0.24 per part.
Change PEM Holes_4 diameter to 0.2000 and save $0.24 per part.

136-0015-11 Plenum Information

Part Quantity: 5

Days to Ship: 10 days

Dynamic Production Data

⊟ Part Properties

| Material | Steel 1010 |
|---|---|
| Finish | no finish |

⊞ Part Feature Data

⊟ Manufacturing

| Quality Rating (1-10) | 6 |
|---|---|
| Minimum Order Quantity | 10 |
| Minimum Lead Time | 2 |

⊟ Part Property Charts

Cost vs Quantity

Cost vs Time to Ship

⊟ Total Order Cost — $200.25

| Single Part Fabrication Cost | $3.70 |
|---|---|
| Total Cost Per Part | $40.05 |
| Total Material Cost | $49.08 |
| Total Finishing Cost | $0.00 |
| Total Setup Cost | $90.00 |
| Handling Cost | $31.52 |
| Shipping Cost | $11.15 |
| Tax (3.5%) | $0.00 |

Please tell us about your capabilities

Machining

[Add a new machine ▼] [Update existing machine ▼]

You currently have listed the following Capabilities:

| Machine Make | Model | Options | Setup Cost (per hour) | Operating Cost (per hour) | Lead Time (<24 hr. job) | Lead Time (>24 hr. job) | ☑ Rush Charge 10% of order |
|---|---|---|---|---|---|---|---|
| Mori Seiki ▼ | MT 4000A/3000 ▼ | FANUL auto ▼ | $150.00 | $100.00 | 4 days | 10 days | Update  Delete |
| Haas ▼ | TM-1 ▼ | See specs. ▼ | $120.00 | $80.00 | 1 day | 1 day | Update  Delete |

Plastic Moulding

[Add a new machine ▼] [Update existing machine ▼]

You currently have listed the following Capabilities:

| Machine Make | Model | Options | Setup Cost (per hour) | Operating Cost (per hour) | Lead Time (<24 hr. job) | Lead Time (>24 hr. job) | ☐ Rush Charge 10% of order |
|---|---|---|---|---|---|---|---|

*FIG. 6*

SYSTEM AND METHOD FOR DESIGN OF A COMPONENT

CROSS-REFERENCE TO RELATED APPLICATIONS

This application claims the benefit of U.S. Provisional Patent Application 60/653,552 (filed 16 Feb. 2005), the entire disclosure of which is hereby incorporated by reference herein.

FIELD OF THE INVENTION

The present invention relates generally to computer-based design systems, and relates more specifically to computer-based design systems that are capable of using dynamically updated information to facilitate the design process.

BACKGROUND OF THE INVENTION

The conventional approach to an engineering design and development effort tends to be inefficient, costly and cumbersome in many respects. For example, the input that designers receive from manufacturers during the design process is generally limited to information relating to particular manufacturing capabilities, and therefore designers often generate designs without the benefit of reliable estimates of the cost or time required to manufacture a component. While prototype machine shops are helpful in the process of finalizing a component design, they can be expensive, and generally may not provide a good indication of costs associated with high volume manufacturing.

Even when a design is completed, the process of finding a qualified manufacturer typically involves an inefficient process of identifying potential candidates through word-of-mouth or a costly search. Cultural and/or language barriers often exist. It is often difficult to accurately determine the quality of a manufacturer's past performance and accurately predict the quality of the proposed future performance. Even where several acceptable manufacturers are identified, such a group is likely to represent only a fraction of the qualified pool of manufacturers. This lessens competition and often results in increased costs and decreased quality for the designer. Furthermore, even when a qualified manufacturer is identified, the process of negotiating an agreement on performance typically requires numerous phone calls and face-to-face meetings. Where manufacturing limitations result in design modifications, additional negotiation between the designer and the manufacturer is often required before a mutually acceptable design is agreed upon that meets both performance and manufacturing requirements. The time and effort entailed in this process is usually significant.

In view of these challenges to the conventional approach, several computer-based systems for estimating design and manufacturing costs have been developed. For example, systems have been developed that are configured to receive design data relating to an object that has been designed using a computer aided design ("CAD") program. Such data is referred to herein as "design information" or "component design information". Such systems are capable of extracting cost factors from the design data, such as the size and shape of the parts that comprise the object. Manufacturing cost estimates are then generated based on generalized manufacturing rules and the extracted cost factors, thereby providing an automated alternative to the conventional approach described herein. These systems allow cost estimates to be generated even when a project is at a preliminary planning stage.

BRIEF SUMMARY OF THE INVENTION

Computer-based systems that are configured to provide automated cost estimation address many of the disadvantages of the conventional approach to locating and negotiating with a qualified manufacturer. However, such systems still suffer from significant disadvantage. For example, when generalized manufacturing rules are applied to the cost factors that are extracted from the design information, it is not possible to account for manufacturer-specific variances and capabilities. For example, such a configuration will result in inaccurate estimates if a particular manufacturer is able to obtain raw materials at a particularly reduced price as compared to other manufacturers. Similarly, use of generalized cost factors cannot provide a designer with accurate data related to a specific manufacturer, such as production times, manufacturing capabilities, and quality ratings based on past production runs. Thus, in view of the foregoing, an improved design system has been developed that is capable of providing a designer with dynamically-updated information associated with potential manufacturers. Example embodiments of such a system are disclosed herein.

In one embodiment of the present invention, a design system is accessible to a designer and a plurality of manufacturers. The design system comprises a first user interface configured to receive design information for a component from the designer. The design system further comprises a second user interface configured to receive manufacturing information from the plurality of manufacturers. The manufacturing information comprises at least process cost information. The design system further comprises a database comprising the manufacturing information associated with each of the plurality of manufacturers. The design system further comprises a cost estimation module. The cost estimation module is configured to generate a cost estimate for producing the component for each of the plurality of manufacturers. The cost estimate is at least partially based on the process cost information. The cost estimation module is further configured to output the cost estimate for one or more of the plurality of manufacturers to the first user interface.

In another embodiment of the present invention, a system comprises a first user interface configured to receive design information for a component from a designer. The system further comprises a second user interface configured to receive manufacturing information from a plurality of manufacturers. The system further comprises an estimation module configured to produce generated manufacturing information for the component and design modification information for the component. The generated manufacturing information and the design modification information are based on the manufacturing information received from the plurality of manufacturers.

In another embodiment of the present invention, a method comprises receiving design information for a component. The method further comprises receiving manufacturing information from a plurality of manufacturers. The manufacturing information includes material cost information and process cost information. The method further comprises identifying one or more qualified manufacturers from the plurality of manufacturers based on the design information and the received manufacturing information. The method further comprises producing generated manufacturing information for a qualified manufacturer based on the manufacturing information associated with the qualified manufacturer. The generated manufacturing information includes at least a cost estimate and a lead time estimate.

In another embodiment of the present invention, a method comprises receiving, from a designer via an electronic network, design information that defines a component. The method further comprises generating an estimate for a manufacturer to produce the component. The estimate (a) is based on manufacturing information received from the manufacturer, and (b) includes a cost estimate. The manufacturing information is received from the manufacturer before the design information is received from the designer. The method further comprises providing the cost estimate to the designer in the form of a binding quotation. The method further comprises receiving a quotation acceptance from the designer. The method further comprises providing the manufacturer with an order to produce the component.

BRIEF DESCRIPTION OF THE DRAWINGS

Example embodiments of the design systems and methods disclosed herein are illustrated in the accompanying drawings, which are for illustrative purposes only. The drawings comprise the following figures, in which like numerals indicate like parts.

FIG. 3A illustrates an example assembly pane usable with certain embodiments of the design system disclosed herein.

FIG. 3B illustrates an example multi-feature assembly pane that includes a plurality of expandable tabs, and that is usable with certain embodiments of the design system disclosed herein.

FIG. 5B illustrates an example user interface of a CAD program that is used to adjust properties of a selected component that is designed using the CAD program.

FIG. 6 illustrates a user interface capable of collecting manufacturing information from a manufacturer.

DETAILED DESCRIPTION OF THE INVENTION

Figure 1:
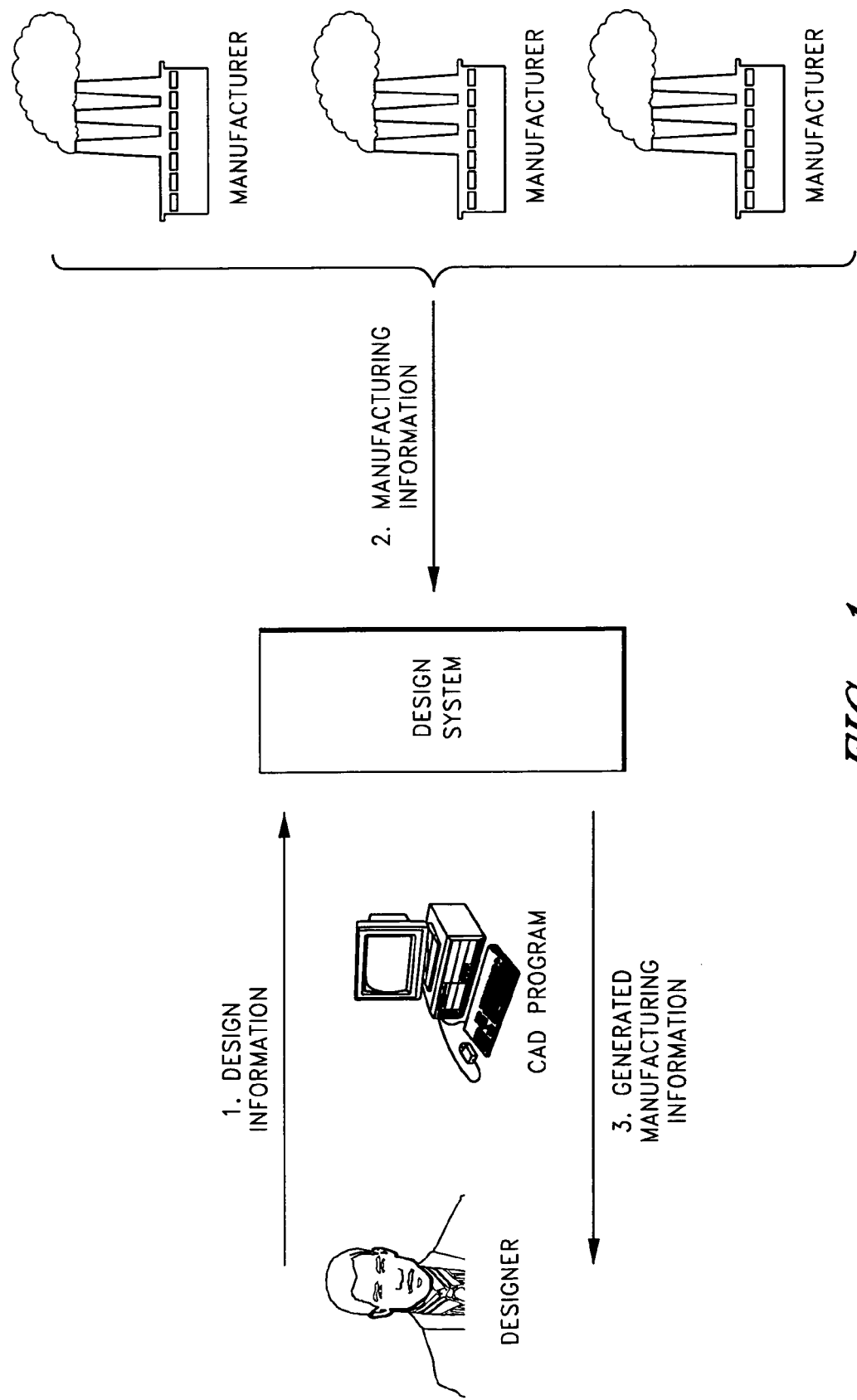
FIG. 1 is a block diagram that schematically illustrates how an example design system facilitates communications and transactions between a designer and a plurality of manufacturers.

Disclosed herein are several embodiments of an improved design system. Certain of the disclosed embodiments are intended to allow designers to more efficiently obtain accurate information from multiple manufacturers, suppliers, assemblers, builders, processors, vendors and other purveyors of goods and/or services (collectively referred to herein as "manufacturers"). This allows the product development cycle to be accelerated, thereby advantageously reducing product development costs for designers, and reducing factory idle time and administrative costs for manufacturers. FIG. 1 schematically illustrates how an example design system facilitates communications and transactions between a designer and manufacturers.

Certain embodiments of the improved design system disclosed herein are configured to interface with and be accessed using a CAD program, as illustrated in FIG. 1. As used herein, the term "CAD program" refers generally to a computer program that is used to assist in the design of a tangible system or object. For example, a CAD program is usable to design and construct a virtual representation of parts, objects, and articles of manufacture collectively referred to herein as "components". The range of components that may be concurrently designed and priced with the present invention include, but are not limited to, components machined from metal billets such as aluminum engine parts, molded plastic or ceramic, hand-crafted components produced from wooden or other natural materials, building materials, components ground from blanks including glass lenses, semiconductor devices, solar panels, printed circuit boards and electronic circuits, and parts manufactured from sheet metal or plate steel. Commonly-used CAD programs include AutoCAD (available from Autodesk, Inc.; San Rafael, Calif.), Visio (available from Microsoft Corporation; Redmond, Wash.), and SolidWorks (available from SolidWorks Corporation; Concord, Mass.), although the design systems disclosed herein are not limited to use with any particular CAD program.

Interfacing the design system with a CAD program advantageously allows a designer to interact with the design system at the same time a component is designed. This also allows data to be efficiently transferred between the CAD program, the design system, the designer, and a manufacturer.

In certain embodiments, the design system provides the designer with dynamically updated information that is based on a component design produced using a CAD program as the component is designed and modified. For example, in one application the information generated by the design system includes a cost estimate for manufacturing the component and an estimate of the length of time it will take to deliver the manufactured component (also referred to as "lead time"). Given this information, the designer is able to modify the component design to reduce the manufacturing cost or the lead time, for example, before the design is finalized. Optionally, the design system provides the designer with information from a plurality of manufacturers, thereby enabling the designer to tailor the component design to the manufacturing capabilities and limitations of a broader range of manufacturers.

The design system includes a database to which manufacturers submit manufacturing information. As used herein, "manufacturing information" refers to information that defines or otherwise characterizes the capabilities or manufacturing resources of a particular manufacturer, the costs associated with using the manufacturer's capabilities, and the times at which the resources may be available or the components producible. Thus, "manufacturing information" includes, but is not limited to, one or more of the following: the number and type of machines or other resources the manufacturer has available, the capability of those machines or resources to perform specific manufacturing operations, the cost of using the manufacturer's machines or resources (including applicable costing algorithms for the machines and/or other processes specific to a particular manufacturer), the cost to perform specific manufacturing operations with the manufacturer's machines or resources, the scheduling availability of the manufacturer's machines, and the cost for use of raw materials. The design system has the flexibility to allow manufacturers to enter manufacturing information in a variety of ways. For example, in one application a manufacturer provides a listing of available machines and the corresponding charges for using those machines per unit of time. In another application, the design system receives information regarding machines having functionality that cannot be or that is not analytically parameterized. In this case, the design system associates such machines with a capability/performance, such as the capability to process material at a particular feed rate, cutting rate or grinding rate; the capability to accept a certain stock size; the capability to machine with a particular travel distance; or the capability to machine with a particular number or type of axes. The design system translates the use of these capabilities into a price or price range based on a machine-specific costing algorithm provided by the manufacturer.

The design system also optionally includes a driver architecture that allows new manufacturing capabilities to be added to the database, such as would result from the availability of new machining tools. In this case, the manufacturer, or other entity, provides the design system with software drivers that include both the capabilities of the new tools, and supplies the design system database with the costs and lead times associated with using the new tools. This configuration advantageously provides the design system with a flexible architecture that is capable of handling later-developed manufacturing capabilities. This optional open architecture also advantageously enables the design system to incorporate data and/or algorithms from manufacturers, including simulators for the manufacturer's tools. For example, in one embodiment the design system executes an existing tool simulator that is provided by a manufacturer.

Regardless of how the manufacturing information is collected from the manufacturers, the design system is optionally configured to abstract the functionality of the manufacturers' machines, thereby allowing the available functionalities to be applied to the component designs that the designer produces using the CAD program. The design system cross-references the features and functions of the component with the available manufacturing functionalities, and determines which manufacturing processes are usable to manufacture the component. The design system is optionally configured to automatically select preferred manufacturing tools. The designer is provided the opportunity to override an automatic manufacturing tool selection, optionally from a list of alternate tools stored in the database.

Once the requisite manufacturing tools are selected, the tool functionality is applied to the component design. By combining the results of this application with the costing algorithms that are also stored in the design system database, the system generates cost estimates, or information that can be used to generate cost estimates, for manufacturing the component design. These cost estimates are optionally supplemented with other cost factors, such as setup costs, material handling costs, and costs associated with rush delivery requests. Furthermore, by collecting additional information from manufacturers, such as factory scheduling data, the cost estimates generated by the design system can be supplemented with lead time estimates and estimates of other parameters of interest to the designer. Thus, this information produced by the design system, which includes cost estimate information but is not necessarily limited to cost estimates, is generally referred to herein as the "generated manufacturing information".

The generated manufacturing information is optionally presented to the designer using the CAD program user interface as a quotation that becomes contractually binding between the designer and manufacturer when accepted by the designer. Quotations are generated by the design system through an automated or semi-automated process, thus allowing the quotation to be provided to the designer in a relatively short time frame, as compared to the conventional negotiation process that occurs between designers and manufacturers, which often takes days, weeks, or longer. For example, in a semi-automated process, a representative of the manufacturer approves the quotation before it is provided to the designer. Where a designer accepts a binding quotation, the design system optionally notifies the manufacturer and provides the manufacturer with additional design details that are needed to begin work on the job. In such a system both designers and manufacturers agree to standard terms before using the design system. Optionally, manufacturer-specific terms are supplied to the design system database by the manufacturer and are presented to the designer before a binding quotation is accepted.

In embodiments wherein the database contains manufacturing information from multiple manufacturers, the design system advantageously provides the designer with an easy way to compare the capabilities of multiple manufacturers. For example, in one such embodiment the generated manufacturing information is provided in the form of a list of quotations received from different manufacturers. The quotation can include a table or other data representation, that includes some or all of the following: the manufacturer/supplier name, manufacturing cost per unit, setup cost, material handling cost, expedited delivery cost, lead time, manufacturer quality rating, required deposit/down payment, manufacturer location, and other data, such as other manufacturing information provided by manufacturers via user interface 134 discussed below. The quotations are optionally sorted based on user specified and/or default criteria such as manufacturing cost per unit, setup cost, material handling cost, expedited delivery cost, lead time, manufacturer quality rating, deposit/down payment, manufacturer location and other quote criteria. This allows the designer to select a manufacturer based on a comparison of a wide variety of different factors, although in certain embodiments the design system is optionally configured to automatically select a preferred manufacturer based on predefined criteria, or to automatically select a subset of the manufacturers based on predefined criteria.

In embodiments in which a manufacturer quality rating is provided to the designer, this rating is based on one or more factors that are developed through customer feedback. Examples of such factors include, but are not limited to, on-time delivery ratings, product quality ratings, customer service ratings, and other data based on the manufacturer's prior transactions and history. Manufacturer quality ratings help designers evaluate the various manufacturers being considered for a particular project. Optionally, analogous ratings are provided to evaluate designers as well as manufacturers. Designer quality ratings help manufacturers evaluate the qualities of a certain designer, such as payment history and credit rating. For example, certain manufacturers will use this information to justify requiring a larger down payment for a project submitted by a designer with a poor credit rating or payment history. These features advantageously allow both manufacturers and designers to build trust amongst each other, and to make more informed choices about the parties with which they elect to do business.

As described herein, this system advantageously allows the designer to modify the component design based on the generated manufacturing information. Such modifications optionally include modifications to component dimensions, dimension tolerances, or materials. In some cases, making such modifications will qualify or disqualify certain manufacturers. The design system is configured to dynamically update the generated manufacturing information based on the modified component design instantaneously or in substantially real-time, thereby showing the designer what effect a particular modification has on the manufacturability of the component, if any.

In addition to providing a designer with real-time feedback regarding possible design modifications, the design system optionally includes an improvement engine that is configured to provide the designer with suggestions to improve the design in certain respects. Such suggestions are generally referred to herein as "design modification information". For example, there is generally a nonlinear relationship between the tolerance of a dimension and the cost of manufacturing a component built to the specified tolerance: extremely small dimensional tolerances typically result in extremely high manufacturing costs. In this case, the design system improvement engine is configured to recognize when a particular design specification, such as an especially narrow dimensional tolerance, accounts for a disproportionate portion of the manufacturing cost and/or lead time for a component. When such a condition is detected, the improvement engine provides the designer with a suggestion to relax the narrow tolerance to produce a substantial reduction in the manufacturing cost and/or lead time.

These same principles are also applicable to other design parameters, and therefore in certain embodiments the improvement engine is capable of providing suggestions regarding parameters such as materials, dimensions, surface finishes, and lead times. For example, in one application the improvement engine notifies the designer that increasing a bending radius will allow the component lead time to be reduced substantially. Or, in another application the improvement engine notifies the designer that changing from metal to plastic will result in a substantial price reduction without compromising the component strength. Or, in yet another application the improvement engine notifies the designer that using a smaller bracket will result in a substantially lower assembly cost. The improvement engine is optionally configured to make certain design modifications automatically, such as a design modification that improves the product design against price and/or lead time.

The improvement engine is optionally configured to allow designers to express the functionality of a component in a series of objective rule forms. This is in contrast to conventional systems where the designer is limited to expressing functionality using specific dimensions and materials. In contrast to conventional systems, certain embodiments of the improvement engine allow a designer to specify objective rule forms using a programming language structure. This allows a component to inherit attributes and goals which the improvement engine uses to create a component design that complies with the defined goals. Goals that are used in this context include both physical goals (such as component size, weight, strength) and manufacturing goals (such as cost minimization and lead time minimization). Physical goals are optionally defined as being price independent, such that the parameter must be satisfied without regard to cost or lead time.

The improvement engine advantageously generates its suggestions based on the actual functionalities supplied by the manufacturers and stored in the database, such that accepting a suggestion results in an advantage as defined by a manufacturer. For example, in one embodiment the improvement engine generates a suggestion index based on the specific manufacturing capabilities provided by the manufacturers. This represents a significant improvement over conventional design suggestion systems, where suggestions are generated by generic rules that are not associated with a manufacturer capability, and therefore result in an advantage that might come to fruition during manufacturing, depending on the actual capabilities of the selected manufacturer.

The design system is optionally configured to allow the designer to override suggested design parameters and specify different non-optimal parameters to understand the impact such changes would have. For example, the design system is optionally configured to provide pricing comparisons for different fabrication techniques, such as machining compared to molding, stamping, etching or casting. Additionally, certain embodiments of the design system are configured to provide dynamic pricing of standard "off-the-shelf" components from one or more suppliers. For example, when the design system identifies a standard component, the system is optionally configured to obtain price quotations for the component from suppliers, optionally by soliciting bids from the buyers based on quantities called for by the designer. In this case, the design system is capable of automatically selecting parts from suppliers' catalogs that meet designer-specified criteria and/or rule-based objectives determined by the CAD program.

Often a component design will comprise several subcomponents. In this case, the design system is optionally capable of separately presenting the designer with generated manufacturing information for both the subcomponents and the assembled component. This advantageously allows the designer to accumulate cost and lead time estimates as an assembly design is constructed, thereby providing the designer with an indication of when a particularly expensive or long lead time subcomponent is added to the assembly. Optionally, the system can generate a report for a component that includes a breakdown to subcomponents, wherein the report lists the cost and lead time for each subcomponent (wherein a subcomponent is identified by a part number/name) from each manufacturer or for a subset of manufacturers, and optionally includes other information as well. The user can instruct the system to sort the report based on cost, on lead time, on manufacturer name, or other criteria.

The design system is also optionally capable of separately presenting the designer with generated manufacturing information that is related to manufacturing the subcomponents (such as manufacturing cost and lead time), and that is related to assembling the subcomponents (such as assembly cost and lead time). Generated manufacturing information that is related to assembling the subcomponents is referred to herein as "generated assembly information". In certain embodiments the generated assembly information is generated by the actual vendors proposing to perform the assembly; such information optionally represents a quotation that becomes binding when accepted by the designer. In other embodiments the generated assembly information is generated by dividing the assembly into individual time-motion elements that are individually priced, and optionally including a labor cost factor where appropriate.

The ability to separately produce generated manufacturing information for subcomponents is particularly useful in cases where a single vendor does not have the capability to produce a complete component as designed. This allows the designer to specify, optionally with the assistance of the design system, the preferred value chain for manufacturing and assembling a complete product. The ability to separately generate assembly cost estimates is particularly useful in cases where the cost for manual assembly is to be compared with the cost for machine or automated assembly.

An example design process using an example embodiment of the design system disclosed herein is as follows. A designer defines a component, such as a three dimensional component, using a CAD program. For standardized component types, this typically involves recognizing the object as a standard item in a CAD database (for example, a dowel), and calling predefined object costing attributes from the CAD database. For standard items, costing attributes include data such as the number of items used in a particular assembly. For customized component types, this typically involves recognizing that the object is manufactured using a particular manufacturing process (for example, by machining), and determining the appropriate costing attributes for such a process. For customized items, costing attributes include feature data for the component which is used, for example, to determine the manufacturing steps used to produce the component, such as the number of holes or the number of bends in a component. In either case, the costing attributes are generated by the CAD program and are passed to the design system. The design system produces generated manufacturing information for the component based on the costing algorithms and the other manufacturing information stored in the design system database. Thus, the costing algorithms that manufacturers submit to the design system database are compatible with the costing attributes generated by the CAD program in this example embodiment.

Figure 2A:
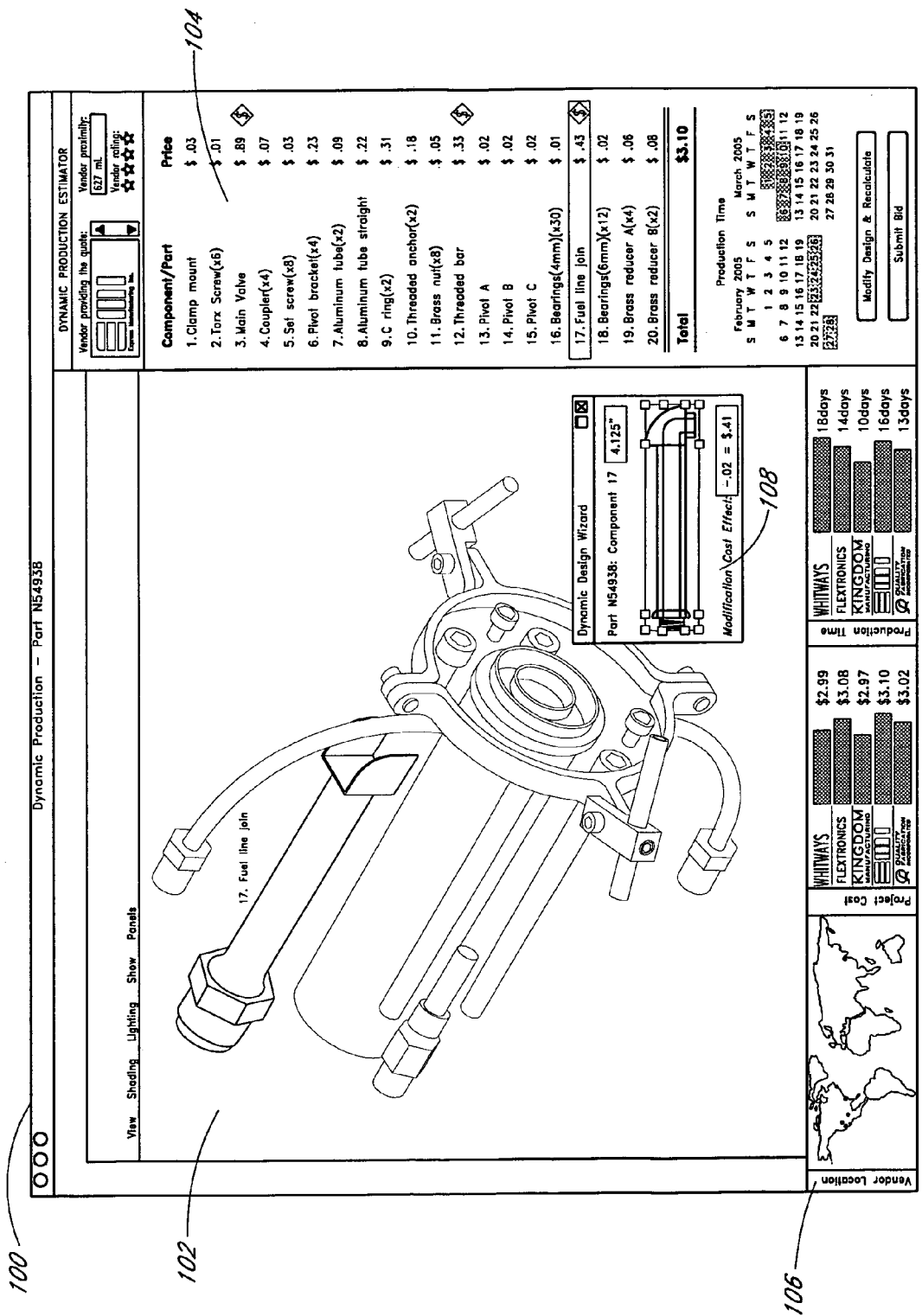
FIG. 2A illustrates a user interface of a CAD program that has been integrated with an example embodiment of the design system disclosed herein.

FIG. 2A illustrates a user interface 100 of a CAD program that has been integrated with an example embodiment of the design system disclosed herein. The user interface 100 includes a design window 102 through which the standard functionalities of the CAD program are accessible, such as drawing tools, menus, settings and the like. Thus, a designer uses the design window 102 and the tools accessible therein to view and modify component design using the CAD program functionality. The user interface 100 further includes features associated with the design system. For example, the user interface 100 includes an assembly pane 104 (illustrated in greater detail in FIGS. 3A and 3B), a manufacturer pane 106 (illustrated in greater detail in FIG. 4), and a component pane 108 (illustrated in greater detail in FIG. 5A). Other panes are used in other embodiments. The panes are optionally closable or collapsible, thereby providing the designer with additional area for working on the component design in the design window 102, if desired.

Figure 2B:
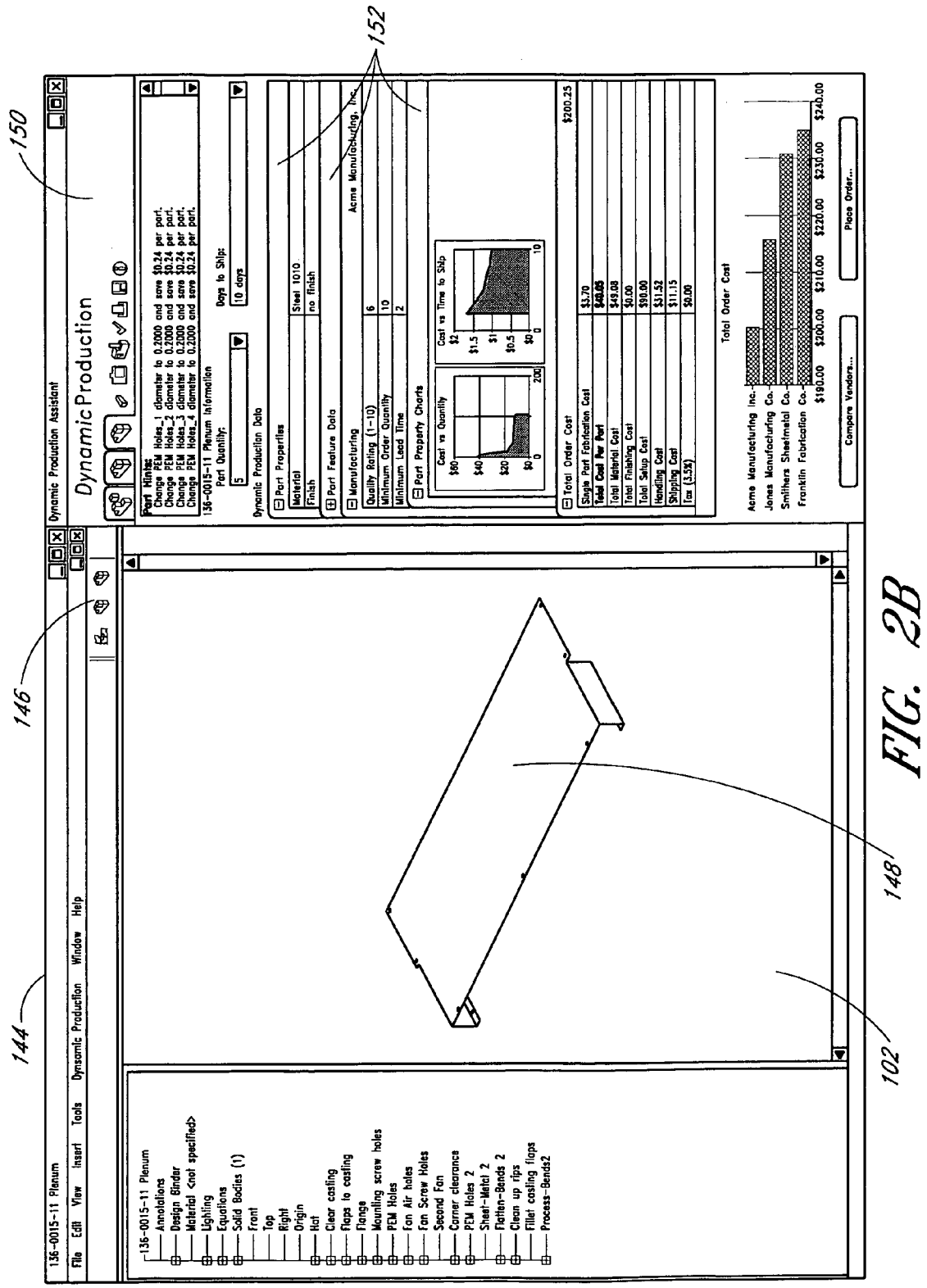
FIG. 2B illustrates a user interface of a CAD program that has been integrated with another example embodiment of the design system disclosed herein.

FIG. 2B illustrates a user interface 144 of a CAD program that has been integrated with another example embodiment of the design system disclosed herein. The user interface 144 includes a design window 102 which can be used to view and modify the design of a component, such as the bent sheet metal component 148 illustrated in FIG. 2B. The user interface 144 further includes a multi-feature assembly pane 150 having one or more expandable tabs 152 through which various functionalities are accessed, as described herein. The multi-feature assembly pane 150 and other panes associated with the design system are displayed or hidden using one or more display controls 146 in the design window 102.

FIG. 3A illustrates an example assembly pane 104, which is configured to provide generated manufacturing information about a selected assembly, such as a selected assembly shown in the design window 102. Specifically, the assembly pane 104 provides a component list 110 for the components that comprise the selected assembly. The component list 110 optionally includes individual component prices 112, as well as an aggregate assembly price 114 for the group of components that comprise the selected assembly. The component list 110 also optionally includes a pricing indicator 148 used to draw the designer's attention to a component price that is especially low as compared to the price quoted by other manufacturers for the same component. Because the pricing data is manufacturer-dependent, certain embodiments of the assembly pane 104 include a manufacturer selector 116 that is used to control the manufacturer for which pricing data is displayed. Optionally, supplemental data relating to a selected manufacturer is provided, such as a geographical proximity field 118 and a manufacturer quality rating field 120. Lead time estimates 122 for a selected manufacturer is also provided in embodiments wherein the manufacturer has provided appropriate scheduling information to the design system database.

Using the manufacturer selector 116 to select another manufacturer causes the assembly pane 104 to display cost, lead time and/or other data for the other manufacturer. In other embodiments, generated manufacturing information for multiple manufacturers is displayed simultaneously in the assembly pane 104, such as by using a tabular format. The assembly pane 104 also optionally includes an update control 124 and a bid submission control 126. The update control 124 is usable to update the data shown in the assembly pane 104 when the component design is modified. The bid submission control 126 is usable to accept the pricing and lead time terms displayed in the assembly pane 104, and to submit a binding order to the selected manufacturer. In embodiments wherein the selected manufacturer is not offering a binding quotation, the bid submission control 126 is excluded or deactivated.

The assembly pane 104 is optionally configured to provide additional manufacturing information and/or generated manufacturing information about the items provided in the component list 110. For example, in certain embodiments the manufacturer's production capacity is provided in terms of components per unit time. Similarly, in applications where it is possible for a component to be produced using different materials or different manufacturing techniques, a manufacturer's capacity to provide such alternatives is also optionally listed in the assembly pane 104.

As illustrated in FIG. 2B, in certain embodiments the user interface 144 includes a multi-feature assembly pane 150, an example of which is illustrated in FIG. 3B. The multi-feature pane 150 includes a suggestion window 154 used to provide the designer with suggestions to improve the component design, as described herein. The multi-feature pane 150 further includes a plurality of expandable tabs 152 through with additional manufacturing information and/or generated manufacturing information is provided. For example, in the illustrated embodiment the expandable tabs 152 display design information (such as physical and/or structural properties of a selected component), manufacturer information (such as manufacturer quality history, and minimum order quantity), and/or generated manufacturing information (such as estimated cost and estimated lead time). The expandable tabs 152 also display costing information 160, thereby allowing the designer to see how much of a particular component cost is attributed to machine setup costs, material costs, finishing costs, handling costs, shipping costs, and other costs.

Figure 3C:
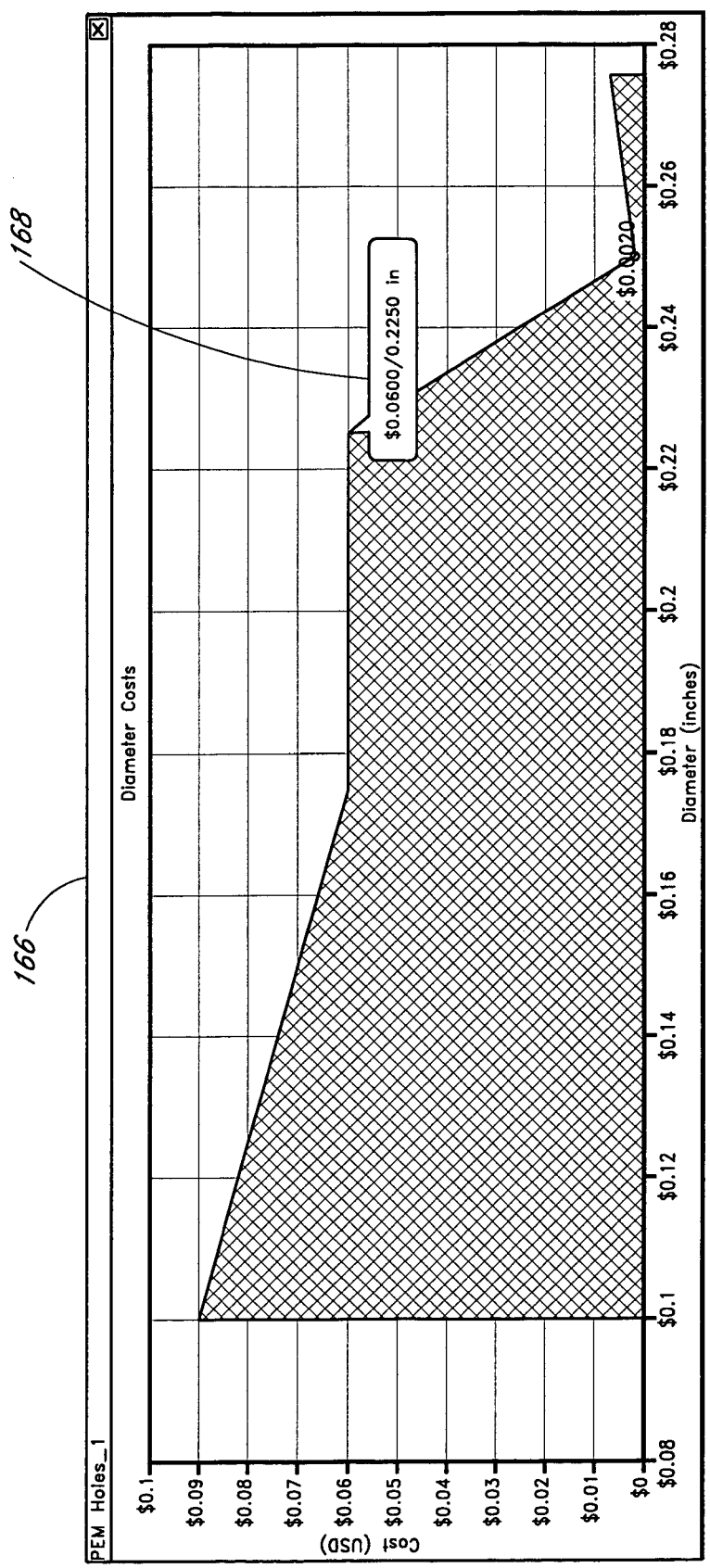
FIG. 3C illustrates an example graph indicating the cost of a component as a function of a physical dimension of the component.

Still referring to FIG. 3B, the multi-feature pane 150 is also optionally configured to graphically display information regarding the component and/or the manufacturer. For example, graph 156 illustrates a plot of component cost versus order quantity, indicating to the designer that substantial savings are obtained if a large quantity order is placed. As another example, graph 158 illustrates a plot of component cost versus lead time, indicating to the designer that substantial savings are obtained if the components are not requested to be manufactured in a short time period. Other data is presented in other embodiments, such as cost as a function of physical dimension, and cost as a function of tolerance. The graphs are optionally displayed in a larger window 166, as illustrated in FIG. 3C, in which hovering a pointing device over a selected portion of the graph provides the designer with a data 168 associated with the selected portion of the graph.

Figure 3D:
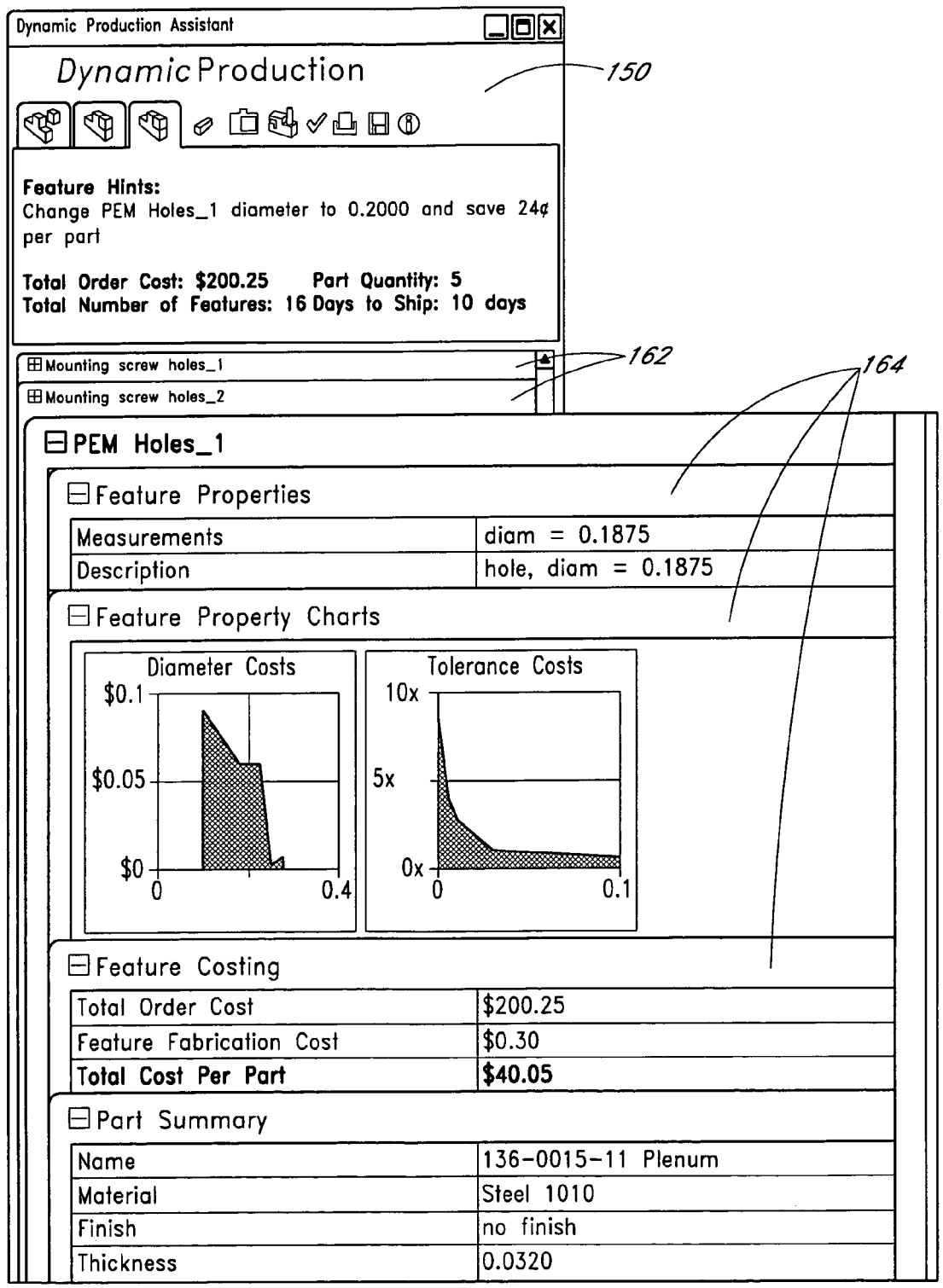
FIG. 3D illustrates an example multi-feature assembly pane that includes a plurality of nested tabs, and that is usable with certain embodiments of the design system disclosed herein.

The multi-feature pane 150 is capable of providing detailed design information and/or generated manufacturing information as described herein for multiple subcomponents that comprise an assembly. For example, FIG. 3D illustrates a multi-feature pane 150 including a plurality of nested tabs. Specifically, the nested tabs include a plurality of upper level tabs 162 corresponding to a plurality of components, wherein selecting an upper level tab 162 displays a plurality of lower level tabs 164 corresponding to design information and/or generated manufacturing information specific to the selected component.

FIG. 3D also illustrates certain embodiments of the design system are capable of displaying costing information not only for individual components of an assembly, but for individual features of a component. For example, FIG. 3D illustrates that the multi-feature pane 150 is capable of displaying a feature cost breakdown of the bent sheet metal component 148 illustrated in FIG. 2B. The multi-feature pane 150 includes a plurality of upper label tabs 162 that correspond to individual component features, such as screw holes, PEM holes and bends. Design information and generated manufacturing information associated with a specific feature is organized under the lower level tabs 164. This provides the designer with information regarding how adjusting design information for a particular feature, for example by adjusting a hole diameter or by adjusting a dimensional tolerance, affects the generated manufacturing information, such as the cost information.

Figure 4:
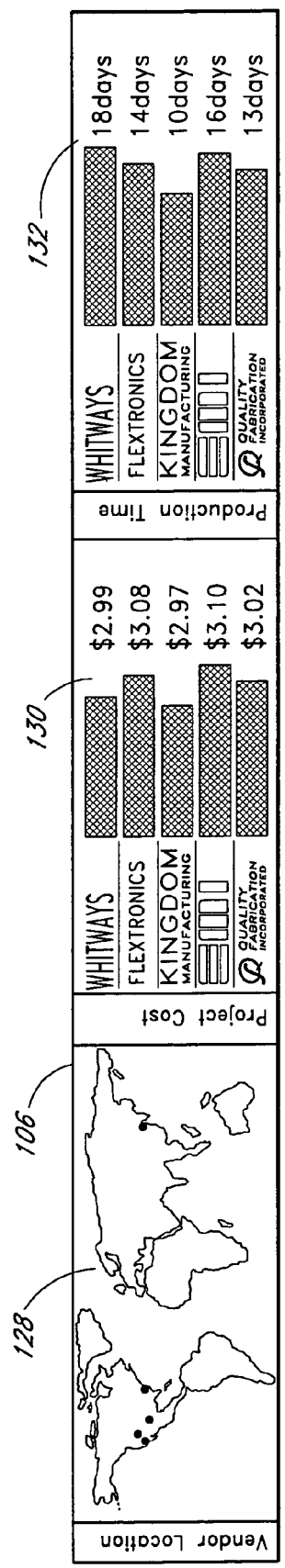
FIG. 4 illustrates an example manufacturer pane usable with certain embodiments of the design system disclosed herein.

FIG. 4 illustrates an example manufacturer pane 106, which is configured to provide a graphical comparison of available manufacturers. For example, in one embodiment the manufacturer pane 106 includes a manufacturer location map 128 illustrating relative geographical locations of available manufacturers, a graphical estimated assembly cost comparison 130, and a graphical estimated lead time comparison 132. The assembly cost comparison 130 provides a list of manufacturers and a cost estimate for the listed manufacturers to make a selected component. Likewise, the lead time comparison 132 provides a list of manufacturers and a lead time estimate for the listed manufacturers to make a selected component. The graphical comparisons 130, 132 optionally provide comparison data for only qualified manufacturers in one embodiment. Where data from a large number of manufacturers is presented, the graphical comparisons 130, 132 are optionally configured to sort the cost and lead time data according to criteria specified by the designer. The designer is also optionally able to filter out manufacturers that do not meet certain criteria, such as maximum lead times or maximum unit costs. The manufacturer pane 106 advantageously provides the designer with a quick way to compare the relative services offered by the available manufacturers. In certain embodiments, such information comparing available manufacturers is additionally or alternatively provided as part of a multi-feature pane 150, as illustrated in FIG. 3B. Other manufacturing information is provided in other embodiments.

Figure 5A:
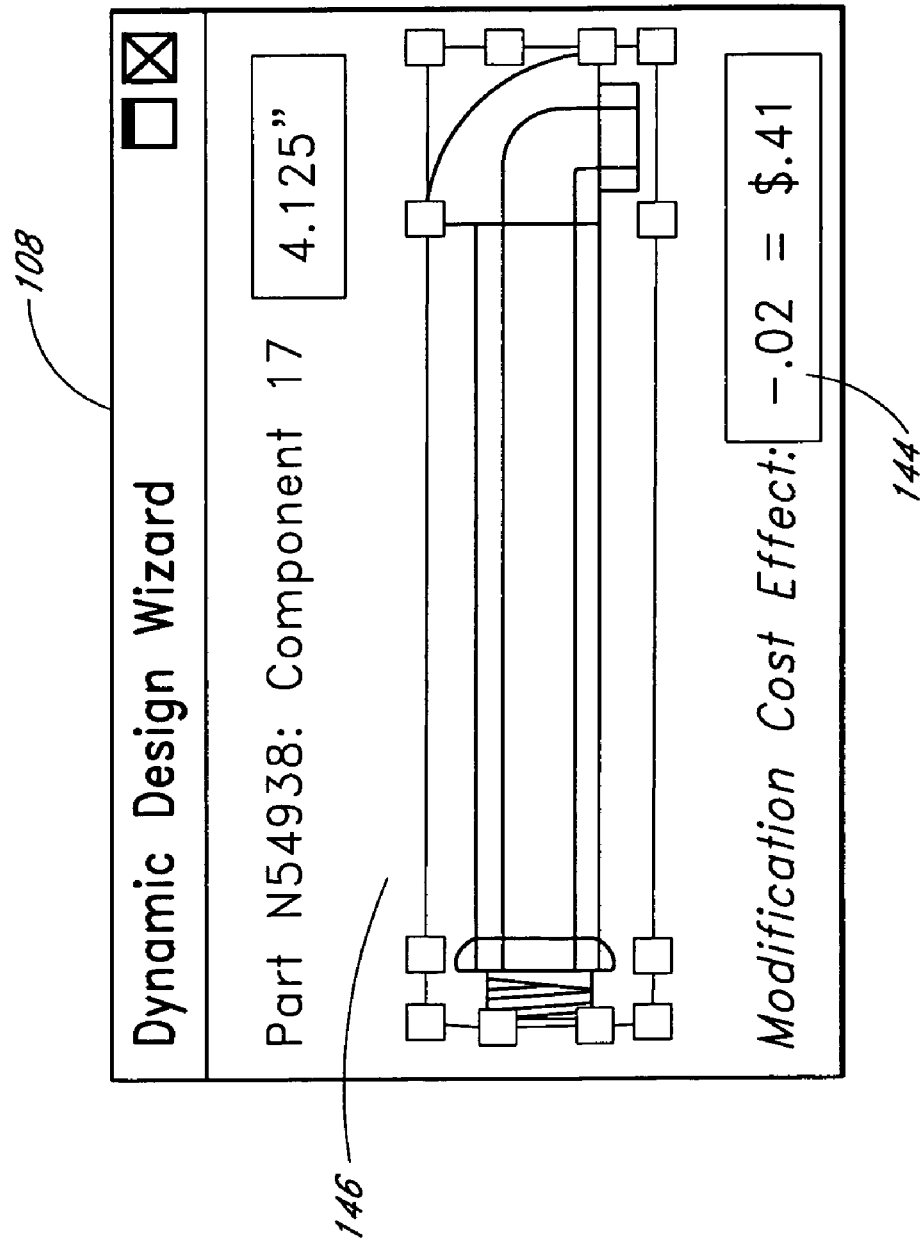
FIG. 5A illustrates an example component pane usable with certain embodiments of the design system disclosed herein.

FIG. 5A illustrates an example component pane 108, which is configured to provide the designer with information relating to a selected component that forms a part of the assembly. The designer uses the component pane 108 to adjust a property of a selected component, such as a dimension, a dimensional tolerance, or a material type. Data provided by the designer to the component pane 108 is used to update the definition of the design information in the CAD program. The component pane 108 optionally includes a modification cost effect field 144 that indicates to the designer what effect the proposed modification has, if any, on the component cost. The component pane 108 optionally provides the designer with a simplified illustration 146 of the selected component.

Figure 5B:
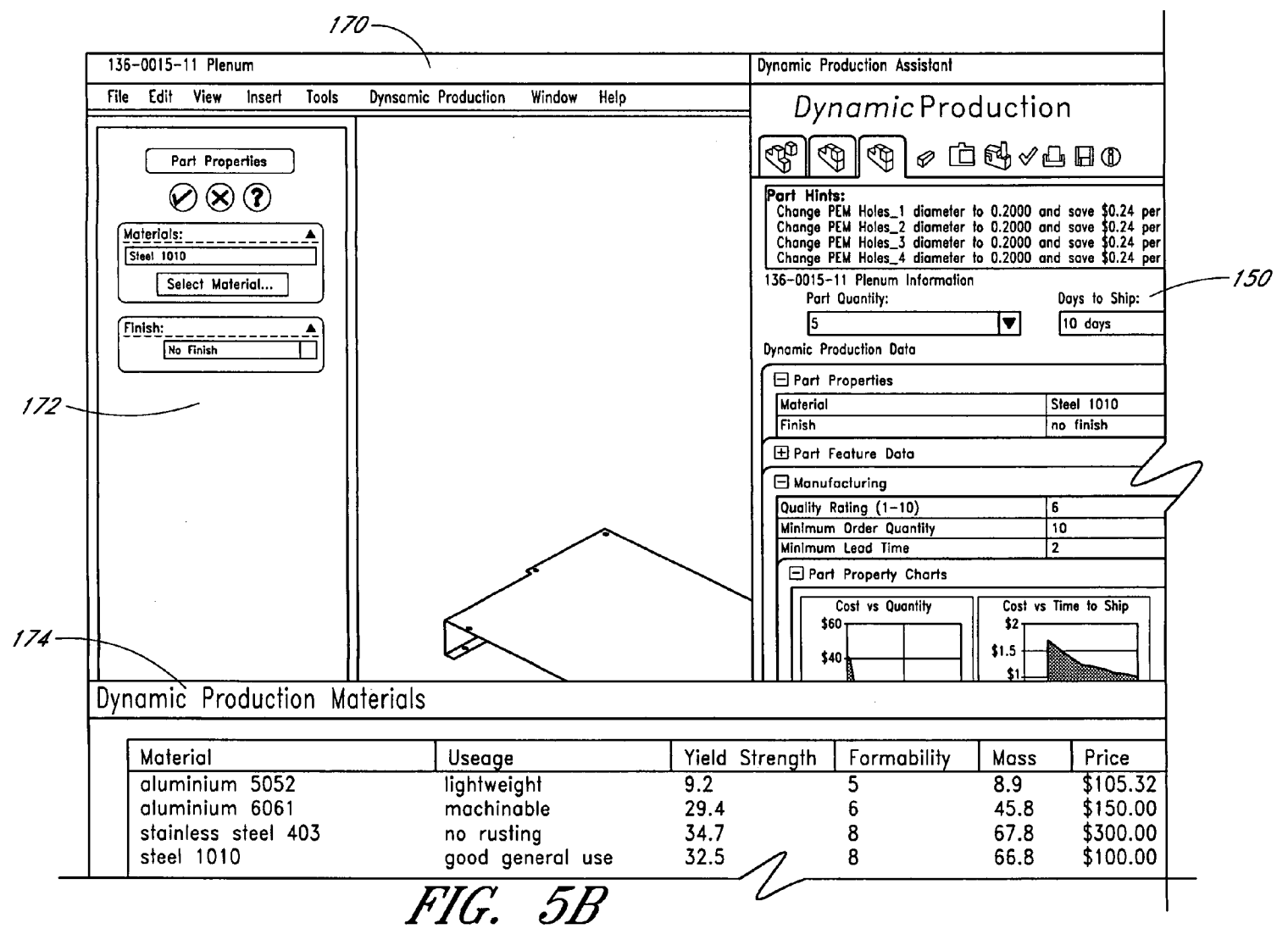

FIG. 5B illustrates another example user interface 170 that is used to update a component design using the CAD program. The user interface 170 includes a multi-feature assembly pane 150, as well as a component properties pane 172 that is usable to adjust properties of a selected component. For example, in the illustrated embodiment the component properties pane 172 is used to adjust the material and finish of the selected component. In such embodiments, selecting a particular material and/or finish causes the component design to be updated in the CAD program, and also causes the generated manufacturing information to be concurrently updated in the multi-feature assembly pane 150. For example, FIG. 5B illustrates that "Steel 1010" with "No Finish" has been selected in the component properties pane, and that these properties also appear in the generated manufacturing data displayed in the multi-feature assembly pane 150.

The design system is optionally configured to provide the designer with a data window 174 that is used to provide the designer with reference data for a selected material, finish, or other property. For example, in an embodiment wherein the component properties pane 172 is used to select the material from which the component is manufactured, the data window 174 displays physical, structural and other data for available materials. The data displayed in the data window 174 is collected from one or more databases that are internal and/or external to the design system.

As described herein, the design system includes a database to which manufacturers submit manufacturing information, including costing algorithms. FIG. 6 illustrates an example user interface 134 for collecting such information from manufacturers. In an example embodiment, the manufacturer accesses the user interface 134 via a browser using a secure network, such as a secure Internet connection. The user interface 134 allows manufacturers to enter capabilities for different manufacturing categories 136, such as machining and plastic molding in the illustrated example. Manufacturers supply information regarding different machines 138 available for the manufacturing categories 136. In the illustrated embodiments, common machines are listed in drop-down menus, thus further facilitating data entry for the manufacturer. For common machines, different model and option categories are provided, thereby further defining the manufacturer's capabilities for the design system. This further definition also enables the design system to more closely associate the manufacturer capabilities with component design features defined by the designer using the CAD program. Optionally, the manufacturer can parameterize the capabilities of a non-standard machine or a machine not listed in the user interface 134. For example, in one embodiment the design system includes an open application programming interface, such that the design system is capable of tracking other manufacturer capabilities.

Still referring to FIG. 6, the manufacturer is also optionally prompted to enter costs 140 and lead times 142 for the available machines. The design system uses such information for the generation of estimates presented in the assembly pane 104 and the manufacturer pane, as described herein. For example, by prompting a manufacturer to enter lead times 142, the design system is integrated with a manufacturer's system for scheduling use of certain machines and/or tools, thereby providing the designer with more accurate lead time estimates.

The user interface 134 is also capable of prompting the manufacturer to enter supplemental options, such as supplemental costs associated with a rush order request, or whether binding quotations should be presented to the designer. If binding quotations should be presented to the designer, the manufacturer uses the user interface 134 to supply terms and conditions that must be presented to and accepted by the designer before a binding quotation is formally accepted. Other options are presented in other embodiments, including the option for manufacturers to define new manufacturing categories 136 or new manufacturing capabilities not listed among the preexisting selections. This option is particularly useful for manufacturers having nonstandard machines or machines with specialized machining capabilities.

Optionally, an update request is automatically periodically sent by the system to the manufacturer, wherein the manufacturer is requested to provide updated manufacturing information via the user interface 134 or otherwise. For example, a system operator can specify that a update request is to be sent out every week, every month, every quarter, every year, or otherwise. This better ensures that the system will have current or fairly current manufacturing information regarding the manufacturer. The update requests can be sent via an email, wherein the email includes a link to the user interface 134, or via other communication mediums. Optionally, the update request can be sent in response to an event, such as the submission of greater than a certain number of orders to the manufacturer since the last update by the manufacturer.

Figure 7:
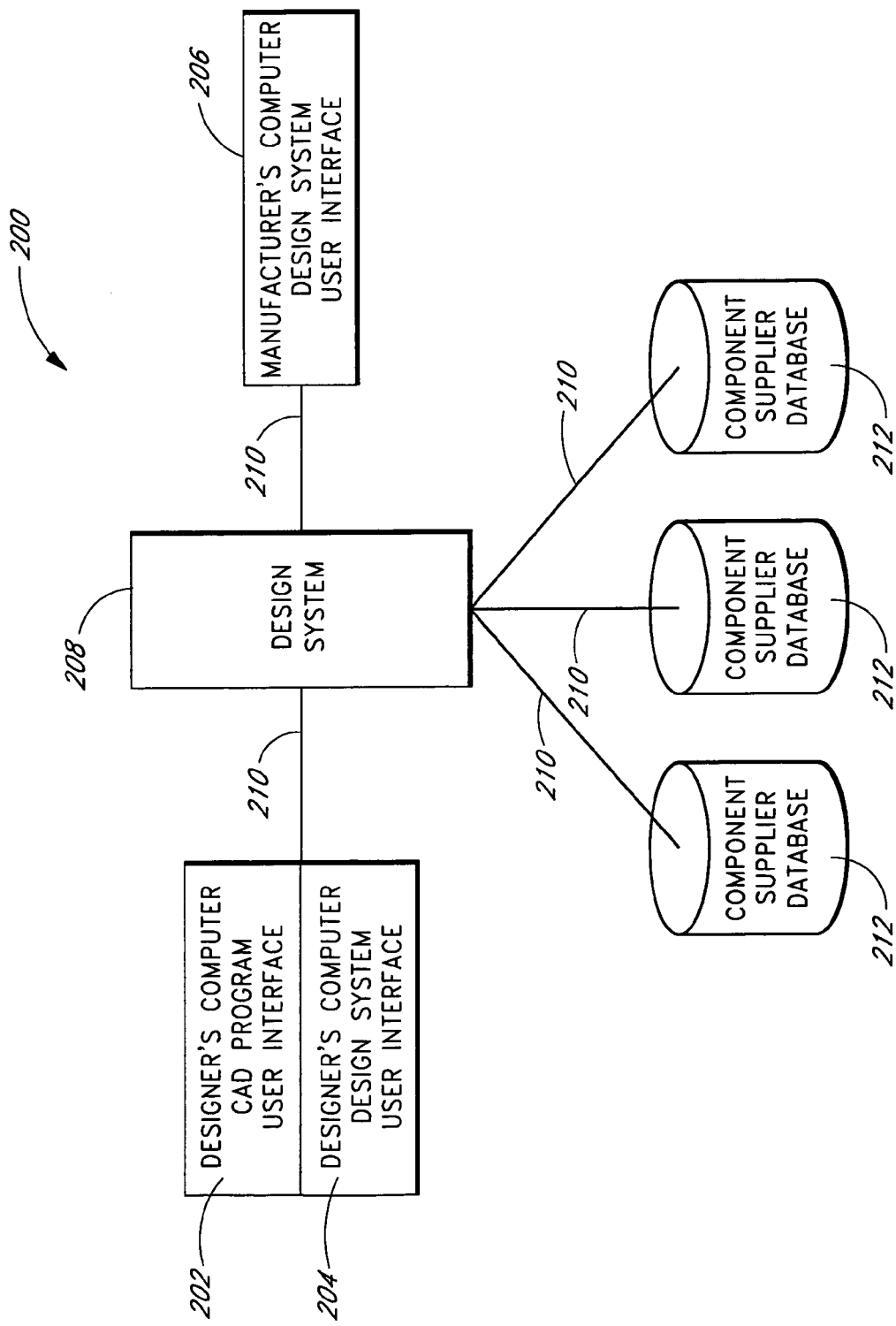
FIG. 7 is a block diagram that schematically illustrates selected components of a system that is compatible with an example embodiment of the design systems disclosed herein.

FIG. 7 schematically illustrates selected components of an example system 200 that is compatible with certain embodiments of the design systems disclosed herein. The system 200 includes a designer's computer that is configured to provide a designer with a composite user interface that includes a CAD program user interface 202 and a design system user interface 204. Examples of such a composite user interface are illustrated in FIGS. 2A and 2B. The system 200 also includes a manufacturer's computer that is configured to provide a manufacturer with a design system user interface 206, an example of which is illustrated in FIG. 6. The designer's computer and the manufacturer's computer are configured to communicate with a design system 208 via network connections 210, which are provided by systems such as the Internet or a local area network. The design system 208 is also configured to obtain production parameters regarding standardized parts from one or more component supplier databases 212. In an example embodiment, the component supplier databases 212 contains information regarding standardized parts, such as pricing information and inventory information. The component supplier databases 212 are optionally maintained by suppliers of standardized parts, and are accessed by the design system 208 using a secure network.

Figure 8:
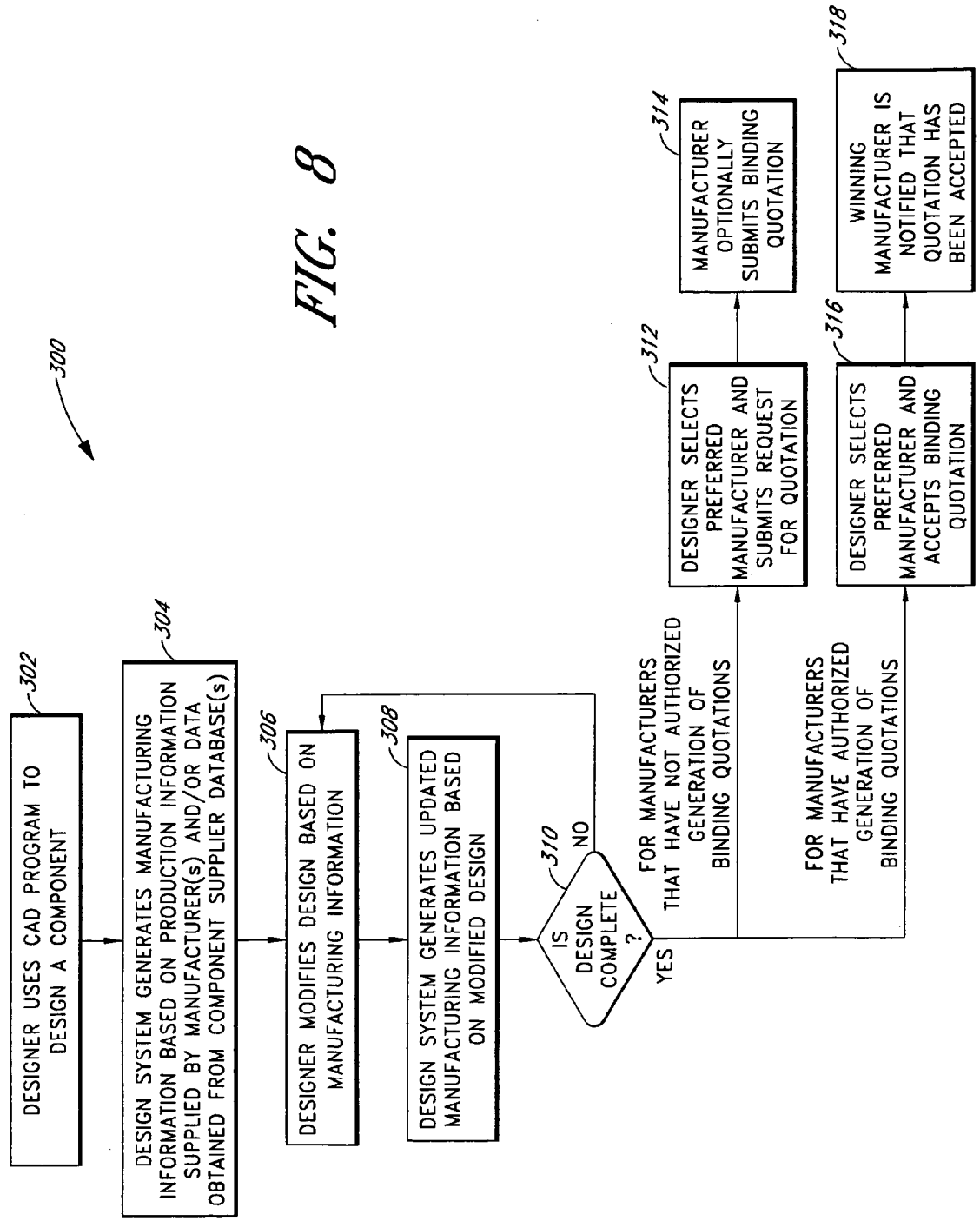
FIG. 8 is a flowchart illustrating a design process using an example embodiment of the design system disclosed herein.

FIG. 8 is a flowchart illustrating a design process 300 using an example embodiment of the design system disclosed herein. In the design process 300, a designer makes a component design using the functionality of a CAD program, as illustrated in operational block 302. The CAD program is integrated with an example embodiment of the design system disclosed herein. The design system monitors the progress of the component design, and when the component design is sufficiently defined, produces generated manufacturing information based on the component design, as illustrated in operational block 304. The generated manufacturing information is based on manufacturing information supplied by one or more manufacturers. In one embodiment the generated manufacturing information includes a cost estimate and a lead time estimate, although in other embodiments less or more information is provided. For example, in a modified embodiment the generated manufacturing information includes design modification information, such as suggestions to improve factors such as price or lead time. The generated manufacturing information is alternatively or additionally based on production parameters relating to standardized parts as received from one or more component supplier databases. The generated manufacturing information is supplied to the designer in a composite user interface with the CAD program, such as the user interfaces illustrated in FIGS. 2A and 2B.

Once the designer has received the generated manufacturing information, the designer can continue to define the component design, as illustrated in operational block 308. In some cases, additional design modifications are based on additional design goals as defined by the designer, while in other cases additional design modifications are based on the generated manufacturing information. This process of modifying the design and producing updated generated manufacturing information based on the modifications is optionally repeated one or many times, as illustrated in decisional block 310. When the designer decides that the design is complete or at a desired stage of design, the designer will have generated manufacturing information from one or more manufacturers having the capabilities required by the finished component design. This generated manufacturing information is provided to the designer using, for example, the assembly pane 104 (illustrated in FIG. 3A), the multi-feature assembly pane 150 (illustrated in FIG. 3B) and/or the manufacturer pane 106 (illustrated in FIG. 4). This allows the designer to select a preferred manufacturer based on the generated manufacturing information. In certain embodiments, the designer selects multiple preferred manufacturers based on different capabilities, such as a first preferred manufacturer for machining, and a second preferred manufacturer for plating.

For manufacturers that have not authorized the generation of quotations that become binding when accepted, the designer selects the preferred manufacturer and submits a request for a binding quotation to that manufacturer, as illustrated in operational block 312. The manufacturer then has the option to submit a binding quotation based on the estimated terms generated by the design system, as illustrated in operational block 314. This arrangement advantageously gives the manufacturer the option to review the component design before being bound to a production contract. For manufacturers that have authorized the generation of quotations that become binding when accepted, the designer selects the bid proposed by the preferred manufacturer, thus generating a binding contract between the designer and the manufacturer, as illustrated in operational block 316. This design system then submits the component design to the selected manufacturer with a notification that the designer has accepted the binding quotation, as illustrated in operational block 318. This arrangement advantageously expedites the process of selecting a manufacturer.

Figure 9:
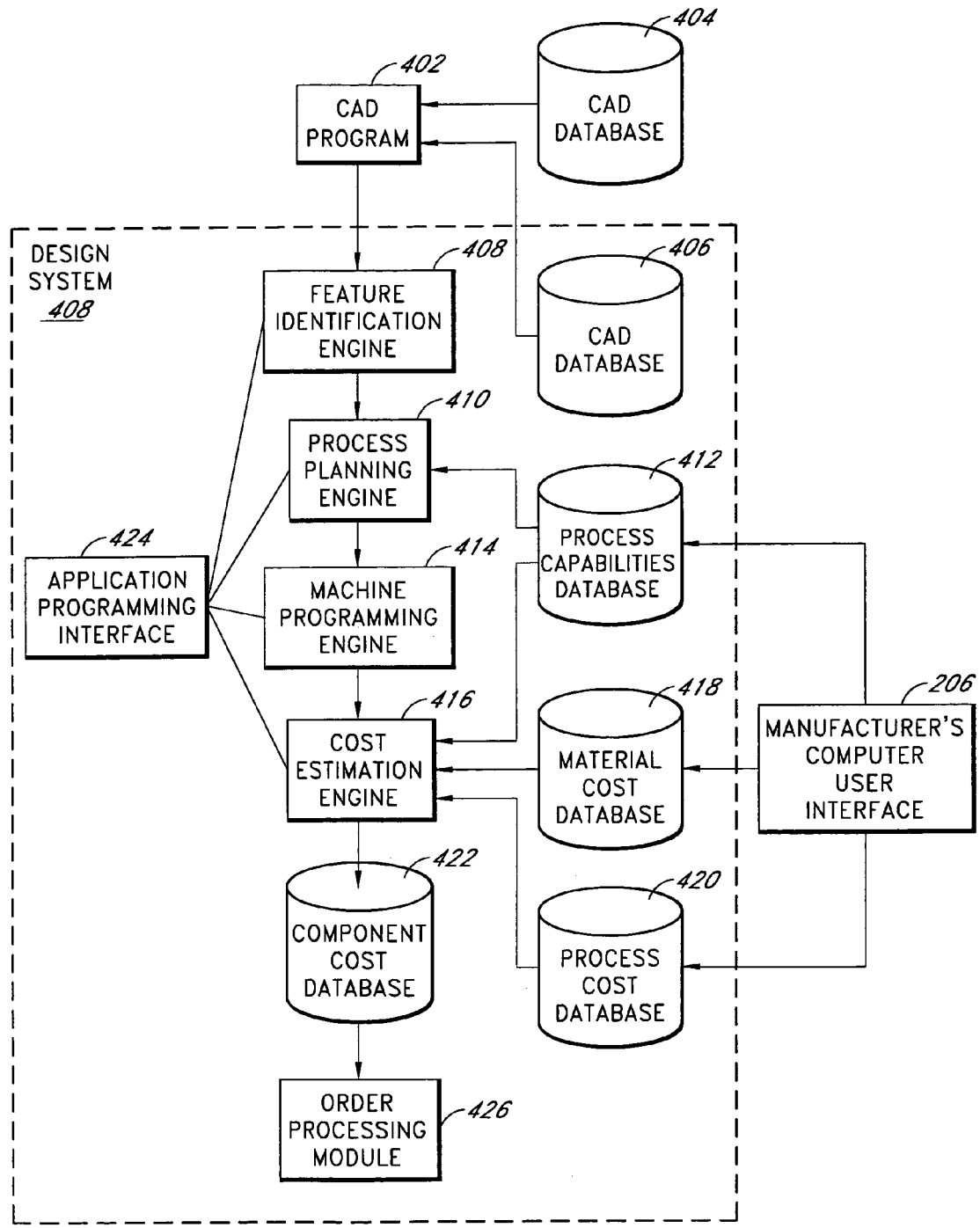
FIG. 9 is a block diagram that schematically illustrates selected components of the example design system of FIG. 6.

FIG. 9 schematically illustrates selected components of the example design system 208 illustrated in FIG. 7. The design system 208 is configured to interface with a CAD program 402 used by a designer to define component designs. In an example embodiment, the CAD program 402 is interfaced with the design system 208 using a plug-in architecture, although other integration techniques are used in other embodiments, such as by use of dynamic links to between the respective software modules and/or databases of the CAD program 402 and the design system.

The CAD program 402 enables the designer to specify properties of a component such as geometry, materials, surface finishes, dimensions and dimensional tolerances. The CAD program 402 includes, but is not limited to, geometry kernel infrastructure, graphical display tools, and a user interface. The CAD program 402 also includes an application programming interface ("API") (not shown) that allows other programming modules, such as the design system 208, to access the mathematical representations of component designs defined in the CAD program 402. Providing such access advantageously allows the design system to directly modify a component design, for example when a design modification suggested by the design system is accepted by the designer. In an example embodiment, the CAD program 402 is capable of importing and exporting files using a variety of different file types.

The CAD program 402 is configured to communicate with one or more CAD databases containing CAD information used to define the components designed using the CAD program 402. Such information includes, but is not limited to, geometric data, dimensional data, dimensional tolerance data, and manufacturing feature data. In an example embodiment, the CAD program 402 has an internal database 404 containing CAD information. The CAD program 402 is additionally or alternatively configured to access one or more external databases containing CAD information, such as an external database 406 managed by the design system 208. Embodiments wherein the CAD program 402 is configured to access an external database 406 are particularly advantageous where the CAD program is not configured to analyze the manufacturability of designed components, because in these cases the internal database 404 will have a limited amount of manufacturing feature data.

Still referring to FIG. 9, the design system 208 includes a feature identification engine 408 that is configured to identify individual manufacturable features of a component defined using the CAD program 402. As used herein, a manufacturable feature represents a manufacturing process, such as a drilled hole, a punched square, a bend, a milled pocket, a weld, or a surface treatment. In one embodiment, the feature identification engine 408 is configured to automatically identify manufacturable features as they are defined in the CAD program 402. For example, in one embodiment manufacturable features are identified by an algorithm that analyzes the mathematical representation of a component surface or group of surfaces. Manufacturable features are also identified by using features that are predefined by the CAD program 402. The feature identification engine 408 is additionally or alternatively configured to receive commands from the designer to manually define manufacturable features.

The feature identification engine 408 operates differently for different manufacturing processes, and therefore operates differently for different manufacturers. For example, for components comprising sheet metal, typical features include circles, squares, rectangles, ovals, circular ended slots, rips, welds, bends, rivets, weld nuts, and standoffs. The list of features will be different for other component types, such as machined components, molded components, cast iron components, and baked components. Furthermore, even where multiple manufacturers are capable of manufacturing a particular feature using the same manufacturing process, the individual manufacturers will still have different quality capabilities, such as different capabilities for meeting a particular dimensional tolerance. This is due to different manufacturers using different manufacturing equipment, for example. Therefore, in an example embodiment the feature identification engine 408 operates recursively, identifying component features separately for individual manufacturers.

Referring again to FIG. 9, the design system 208 further comprises a process planning engine 410 that is configured to determine a sequence of manufacturing steps used to create the manufacturable features identified by the feature identification engine 408. The process planning engine 410 uses algorithms stored in a process capabilities database 412 and a heuristic process to determine a preferred manufacturing sequence, and optionally a preferred manufacturing technique and/or tool. The process capabilities database 412 includes manufacturing capability data as defined by one or more manufacturers using the user interface 206 (also illustrated in FIGS. 6 and 7). In an example embodiment, the process capabilities database 412 is automatically updated when a manufacturer provides new manufacturing information using the user interface 206.

The process planning engine 410 is capable of identifying qualified manufacturers by comparing the manufacturing capabilities used to create a particular feature with the manufacturing capabilities for a specific manufacturer, as defined in the process capabilities database 412. The process planning engine 410 is additionally or optionally configured to receive commands from the designer to manually define the manufacturing sequence, technique and/or tools. Because the manufacturing sequence is often manufacturer-dependent, the process planning engine 410 operates recursively in an example embodiment, developing preferred processes for different manufacturers individually.

The example design system 208 optionally comprises a machine programming engine 414 that is configured to develop a program usable with a computer controlled manufacturing machine, such as a computer controlled mill or lathe. By simulating the developed program, the machine programming engine 414 is also capable of calculating the time required to produce a particular component. In certain embodiments, the program development and/or simulation are performed by a module of the design system 208 (that is, by the machine programming engine 414), while in other embodiments the program development and/or simulation are performed by an external module. The results of the simulation are manufacturer dependent. For example, a manufacturer providing a lower cost estimate will generally operate machines at higher speeds, thus resulting in greater throughput at the cost of wide tolerances and rougher finishes. Conversely a manufacturer providing a higher cost estimate will generally operate machines at lower speeds, thus resulting in tighter tolerances and finer finishes at the cost of lower throughput. Consequently, the machine programming engine 414 operates recursively in an example embodiment, running separate simulations for different manufacturers.

Still referring to FIG. 9, the example design system 208 further comprises a cost estimation engine 416 that is configured to calculate a component cost based on data generated by the process planning engine 410, the machine programming engine 414, and the feature identification engine 408. The cost estimation engine 416 also relies upon manufacturing information provided via the user interface 206. Such information includes information relating to the cost of raw materials ("material cost information") stored in database 418, and information associating a cost with the act of performing a particular manufacturing process or manufacturing step ("process cost information") stored in database 420. For example, a cost particular to a manufacture may be associated with a step of cutting a piece sheet metal, drilling a hole, or folding the sheet metal a determined angle. The process cost information is based on the amount of time a particular machine is used in certain embodiments, and is based on the number of components produced in other embodiments. In an example embodiment, the databases 418, 420 are automatically updated when a manufacturer provides new or updated manufacturing information using the user interface 206. The cost estimation engine 416 also optionally considers other costing information related to the manufacture and distribution of a component, such as setup costs, tooling costs, finish work (for example, plating or painting), shipping, handling, and taxes. In embodiments wherein there exist a plurality of qualified manufacturers, the cost estimation engine 416 generates separate cost estimates for the qualified manufacturers individually.

In certain embodiments, the design system 208 is configured to check for conditions wherein a particular manufacturing feature or design requirement accounts for a substantial portion of the component cost. Examples of such conditions include use of especially narrow tolerances or especially expensive materials. Where such conditions are detected, the designer is provided with a design suggestion to reduce the aggregate component cost. Such conditions are typically referred to as design for manufacturing ("DFM") rules.

Conventionally, DFM rules comprise generalized rules for certain manufacturing techniques. For example, a sheet metal machining technique is associated with DFM rules relating to non-standard tool sizes, especially small bend radii, especially large bend radii, especially small flanges, features positioned especially close to an edge, especially closely-spaced bends, and features that require a relief bend or rip. The DFM rules used by certain embodiments of the design system 208 disclosed herein also include manufacturer-specific rules, and therefore in certain embodiments, the design system 208 is configured to apply a specific set of DFM rules for each of the qualified manufacturers. Custom DFM rules for individual manufacturers are stored in the process capabilities database 412, and are optionally derived from data collected using the user interface 206.

The design system 208 uses the information generated by the cost estimation engine 416 to populate a component cost database 422. The component cost database 422 includes generated manufacturing information, such as component cost estimates and component lead time estimate data. The data in the component cost database 422 is presented to the designer to select a preferred manufacturer, for example using the assembly pane 104, the multi-feature assembly pane 150, and/or the manufacturer pane 106, which are illustrated in FIGS. 3A, 3B and 4, respectively.

The design system 208 optionally includes an API 424 for programming custom algorithms for generating manufacturing data, such as cost estimate data and/or lead time data. The API 424 is used to replace or enhance the default algorithms described herein with respect to the feature identification engine 408, the process planning engine 410, the machine programming engine 414, and/or the cost estimation engine 416, which contain API functions used to access the relevant databases described herein. Thus the API 424 is also optionally used to create and edit data within the process capabilities database 412, the material cost database 418, and the process cost database 420. This advantageously allows the functionality of the design system 208 to be expanded to analyze the manufacturability of a broader range of component types.

Still referring to FIG. 9, the design system 208 includes an order processing module 426 that is configured to obtain an order confirmation from the selected manufacturer, authorize payment from the designer, and settle payment to the manufacturer. In an example embodiment secure socket layer ("SSL") transport layer security ("TLS") encryption is used to protect transaction communications from being intercepted. Using public key cryptography and security certificates, SSL/TLS offers a mechanism for clients and servers to authenticate each other and engage in secure communication. In certain embodiments, a third party payment processing service is used to facilitate the process of securely authorizing and settling payment. In such embodiments an API provided by the payment processing service is integrated with the design system 208.

Figure 10:
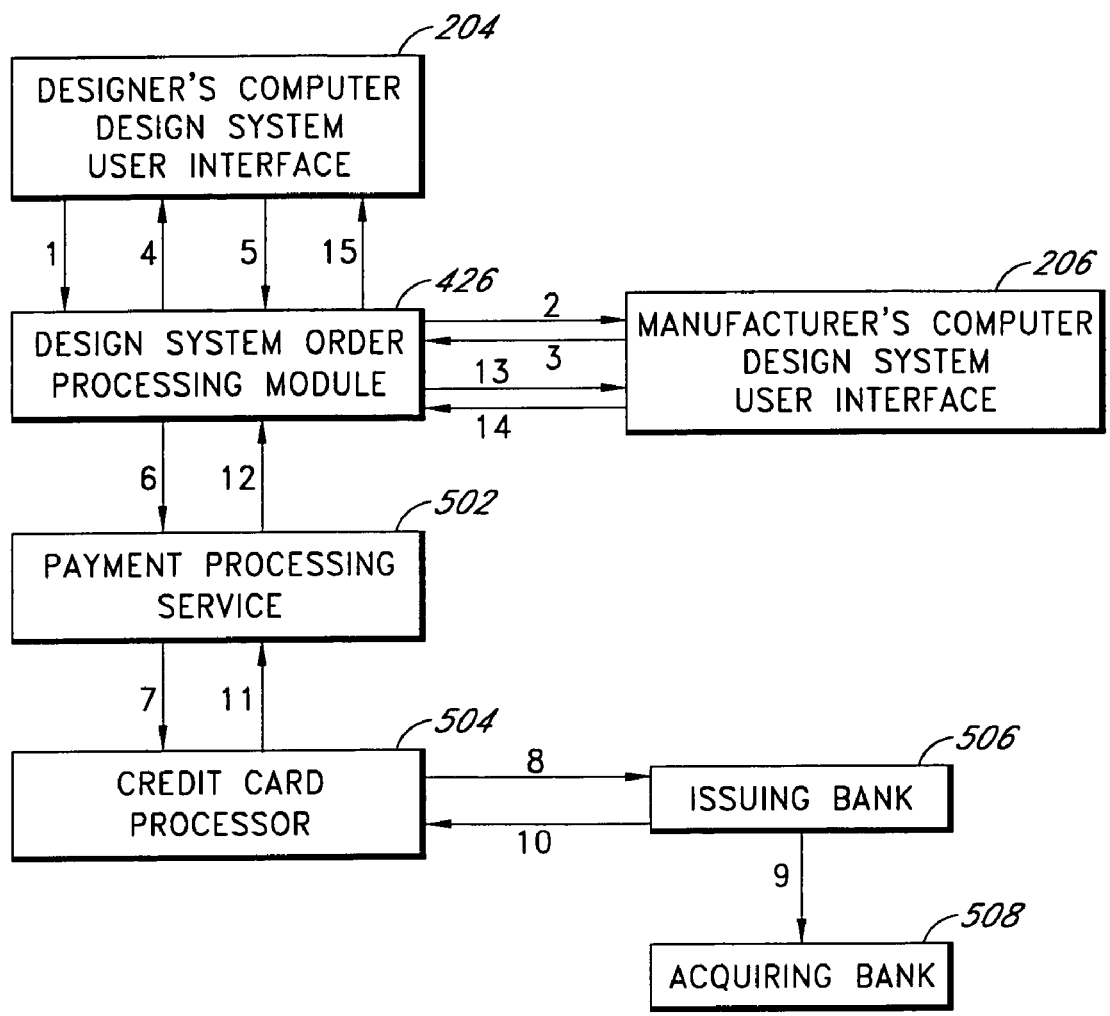
FIG. 10 is a dataflow diagram that schematically illustrates a dataflow generated when an order is placed using an example embodiment of the design systems disclosed herein.

FIG. 10 schematically illustrates an example dataflow generated by the order processing module 426 when an order is placed using the design system 208. In an example embodiment, the order process is initiated when a designer accepts a quotation presented with the design system user interface 204. Thus, dataflow 1 illustrated in FIG. 10 represents the design system order processing module 426 receiving this acceptance from the user. The order processing module 426 forwards the order details to the manufacturer, as indicated by dataflow 2, which optionally views the order details using the manufacturer's computer design system user interface 206. In embodiments wherein the order is not binding until accepted by the manufacturer, the manufacturer's acceptance of the order is indicated by dataflow 3.

After the manufacturer is notified of the designer's order, and after the manufacturer accepts the order if required, the order processing module 426 notifies the designer that the order is confirmed, as indicated by dataflow 4. Thus, in embodiments wherein the manufacturer's acceptance is not required, a quotation to the design becomes binding upon acceptance, and the designer is notified of the order confirmation as soon as the order is transmitted to the manufacturer.

The designer uses user interface 204 to provide payment information to the order processing module 426, as indicated by dataflow 5. Examples of payment information include bank account information, wire transfer information, credit card information, or information relating to other payment methods accepted by the manufacturer. Upon receiving the payment information, the order processing module supplies the payment information to a payment processing service 502, as indicated by dataflow 6. The payment processing service optionally routes the payment information to a processor, such as a credit card processor 504, as indicated by dataflow 7. The credit card processor 504 or the payment processing service 502 provide payment instructions to the issuing bank 506, and indicated by dataflow 8. The issuing bank 506 transfers the authorized funds to the acquiring bank 508, as indicated by dataflow 9. The issuing bank 506 sends a transaction result status, such as transaction completed or transaction failed, to the payment processing service 502, optionally via the credit card processor 504, as indicated by dataflow 10 and dataflow 11. The payment processing service 502 then forwards this transaction result status to the order processing module 426, as indicated by dataflow 12.

After receiving the transaction result status, the order processing module 426 notifies the manufacturer that payment has been effected, as indicated by dataflow 13. The manufacturer is provided with another opportunity to reject the transaction, for example if the payment transaction failed. The manufacturer's instructions, represented by dataflow 14, are returned to the order processing module 426, which then notifies the designer whether the transaction was successfully completed, as indicated by dataflow 15.

The example dataflow illustrated in FIG. 10 is modified in certain embodiments. For example, in certain embodiments the issuing bank 506 simply authorizes the fund transfer initially, and does not transfer the funds until after the manufacturer has been notified of the authorization.

SCOPE OF THE INVENTION

While the foregoing detailed description discloses several embodiments of the present invention, it should be understood that this disclosure is illustrative only and is not limiting of the present invention. It should be appreciated that the specific configurations and operations disclosed can differ from those described above, and that the methods described herein can be used in contexts other than manufacturing design systems.

I claim:

1. A design system accessible to a designer and a plurality of manufacturers, the design system comprising:
    a code stored on a computer readable medium, that when executed by a computer is configured to provide:
    a first user interface configured to receive design information for a component from the designer;
    a second user interface configured to receive manufacturing information from the plurality of manufacturers, wherein the manufacturing information comprises at least process cost information;
    a database comprising the manufacturing information associated with each of the plurality of manufacturers; and
    a cost estimation module configured to:
        generate a cost estimate for producing the component for each of the plurality of manufacturers, wherein the cost estimate is at least partially based on the process cost information and on a payment history associated with the designer, and
        output the cost estimate for one or more of the plurality of manufacturers to the first user interface.

2. The design system of claim 1, wherein the first user interface is configured to provide the designer with a listing of qualified manufacturers.

3. The design system of claim 1, wherein the component forms part of an assembly, and wherein the cost estimation module is configured to generate cost estimates for all components comprising the assembly.

4. The design system of claim 1, wherein the cost estimation module is further configured to generate design modification information, wherein the design modification information is based on the manufacturing information.

5. The design system of claim 1, wherein the cost estimation module is further configured to generate design modification information, wherein:
    the design modification information is based on the manufacturing information; and
    accepting the design modification information causes the cost estimate to decrease.

6. The design system of claim 1, wherein the cost estimation module is further configured to generate a lead time estimate for producing the component, wherein the lead time estimate is based on manufacturing information received from the plurality of manufacturers.

7. The design system of claim 1, further comprising a feature identification module configured to analyze the design information and to identify one or more manufacturable features of the component.

8. The design system of claim 1, further comprising a feature identification module configured to analyze the design information and to identify one or more manufacturable features of the component, wherein the cost estimate includes sub-estimates for the one or more manufacturable features.

9. The design system of claim 1, further comprising a process planning engine configured to identify one or more qualified manufacturers based on the manufacturing information.

10. A system comprising:
    a code stored on a computer readable medium, that when executed by a computer is configured to provide:
    a first user interface configured to receive design information for a component from a designer;
    a second user interface configured to receive manufacturing information from a plurality of manufacturers; and
    an estimation module configured to:
    produce generated manufacturing information for the component and design modification information for the component, wherein the generated manufacturing information and the design modification information are based on the manufacturing information received from the plurality of manufacturers; and
    generate a manufacturing cost estimate wherein the manufacturing cost estimate is at least partly based on a payment history associated with the designer and on the manufacturing information received from the plurality of manufacturers.

11. The system of claim 10, wherein the design modification information is presented to the designer using the first user interface.

12. The system of claim 10, wherein the manufacturing information comprises design for manufacturing rules associated with a machine used by a selected one of the plurality of manufacturers.

13. The system of claim 10, further comprising a machine programming engine that is configured to generate a program usable to machine the component using a computer controlled manufacturing machine.

14. The system of claim 10, further comprising a machine programming engine that is configured to estimate a time used to machine the component.

15. The system of claim 10, wherein the plurality of manufacturers use more than one manufacturing technique.

16. The system of claim 10, wherein the plurality of manufacturers use manufacturing techniques other than molding.

17. The system of claim 10, wherein the manufacturing information includes material cost information and process cost information, and wherein the generated manufacturing information comprises a cost estimate.

18. The system of claim 10, wherein the manufacturing information includes lead time data and the generated manufacturing information comprises a lead time estimate.

19. A method comprising:
    receiving design information for a component;
    receiving manufacturing information from a plurality of manufacturers, wherein the manufacturing information includes material cost information and process cost information;

identifying one or more qualified manufacturers from the plurality of manufacturers based on the design information and the received manufacturing information; and producing, using a computer, generated manufacturing information for a qualified manufacturer based on the manufacturing information associated with the qualified manufacturer, wherein the generated manufacturing information includes at least a manufacturing cost estimate and a lead time estimate, wherein the manufacturing cost estimate is at least partly based on a payment history associated with the designer.

20. The method of claim 19, wherein the lead time estimate is based on lead time data received from the qualified manufacturer.

21. The method of claim 19, further comprising receiving manufacturing information from a first manufacturer that uses a first manufacturing process, and a second manufacturer that does not use the first manufacturing process.

22. The method of claim 19, further comprising generating a program usable to manufacture the component using a computer controlled manufacturing machine.

23. The method of claim 19, wherein:
the design information is received via a designer user interface; and
the manufacturing cost estimate and the lead time estimate are displayed via the designer user interface.

24. The method of claim 19, wherein the generated manufacturing information is a quotation that becomes binding when accepted by a recipient.

25. The method of claim 19, wherein the manufacturing information includes design for manufacturing rules associated with a machine used by a selected manufacturer.

26. A method comprising:
receiving, from a designer via an electronic network, design information that defines a component;
generating, using a computer, an estimate for a manufacturer to produce the component, wherein:
the estimate (a) is based on manufacturing information received from the manufacturer, and (b) includes a manufacturing cost estimate wherein the manufacturing cost estimate is further based on a payment history associated with the designer, and
the manufacturing information is received from the manufacturer before the design information is received from the designer;
providing the manufacturing cost estimate to the designer in the form of a binding quotation;
receiving a quotation acceptance from the designer; and
providing the manufacturer with an order to produce the component.

27. The method of claim 26, further comprising prompting the manufacturer to provide updated manufacturing information.

28. The method of claim 26, wherein the estimate further includes a lead time estimate that is based on lead time data received from the manufacturer.

29. The method of claim 26, wherein the estimate further includes quality history data relating to the manufacturer.

30. The method of claim 26, further comprising producing design modification information that is based on the manufacturing information.

31. The method of claim 26, wherein:
the designer provides the design information using a user interface; and
the binding quotation is provided to the designer using the user interface.

32. The method of claim 26, wherein the order is a prepaid order.

* * * * *

UNITED STATES PATENT AND TRADEMARK OFFICE
CERTIFICATE OF CORRECTION

| | |
|---|---|
| PATENT NO. | : 7,603,191 B2 |
| APPLICATION NO. | : 11/356430 |
| DATED | : October 13, 2009 |
| INVENTOR(S) | : William Gross |

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 131 days.

Signed and Sealed this

Fifth Day of October, 2010

David J. Kappos
*Director of the United States Patent and Trademark Office*